(12) United States Patent
Thees et al.

(10) Patent No.: US 9,634,088 B1
(45) Date of Patent: Apr. 25, 2017

(54) JUNCTION FORMATION WITH REDUCED $C_{EFF}$ FOR 22NM FDSOI DEVICES

(71) Applicant: GLOBALFOUNDRIES Inc., Grand Cayman (KY)

(72) Inventors: Hans-Juergen Thees, Dresden (DE); Peter Baars, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/185,267

(22) Filed: Jun. 17, 2016

(51) Int. Cl.
| | | |
|---|---|---|
| H01L 21/336 | (2006.01) | |
| H01L 29/06 | (2006.01) | |
| H01L 29/08 | (2006.01) | |
| H01L 29/417 | (2006.01) | |
| H01L 29/165 | (2006.01) | |
| H01L 29/78 | (2006.01) | |
| H01L 29/66 | (2006.01) | |
| H01L 21/02 | (2006.01) | |
| H01L 21/311 | (2006.01) | |

(52) U.S. Cl.
CPC ...... *H01L 29/0642* (2013.01); *H01L 21/0217* (2013.01); *H01L 21/31111* (2013.01); *H01L 29/0847* (2013.01); *H01L 29/165* (2013.01); *H01L 29/41783* (2013.01); *H01L 29/66636* (2013.01); *H01L 29/78* (2013.01); *H01L 29/7848* (2013.01)

(58) Field of Classification Search
None
See application file for complete search history.

(56) References Cited

U.S. PATENT DOCUMENTS

2009/0280579 A1\* 11/2009 Pal ..................... H01L 29/7848
 438/5

\* cited by examiner

*Primary Examiner* — Jack Chen
(74) *Attorney, Agent, or Firm* — Amerson Law Firm, PLLC

(57) ABSTRACT

A method of forming a semiconductor device is disclosed including providing a silicon-on-insulator substrate comprising a semiconductor bulk substrate, a buried oxide layer formed on the semiconductor bulk substrate and a semiconductor layer formed on the buried oxide layer, and forming a transistor device on the silicon-on-insulator substrate including providing a gate structure on the semiconductor layer having a gate electrode and a first cap layer on the gate electrode, growing an oxide liner on the transistor device having a first part covering the gate structure and a second part covering the semiconductor layer, forming a second cap layer on the oxide liner, at least partially removing the second part of the oxide liner underneath the second cap layer and the first part of the oxide liner, and epitaxially forming raised source/drain regions on the semiconductor layer.

14 Claims, 14 Drawing Sheets

JUNCTION FORMATION WITH REDUCED $C_{EFF}$ FOR 22NM FDSOI DEVICES

BACKGROUND

1. Field of the Disclosure

Generally, the present disclosure relates to the fabrication of integrated circuits and semiconductor devices, and, more particularly, to forming silicon-on-insulator (SOI) semiconductor devices.

2. Description of the Related Art

The fabrication of advanced integrated circuits, such as CPUs, storage devices, application specific integrated circuits (ASICs) and the like, requires the formation of a large number of circuit elements on a given chip area according to a specified circuit layout. In a wide variety of electronic circuits, field effect transistors represent one important type of circuit element that substantially determines performance of the integrated circuits. Generally, a plurality of process technologies are currently practiced for forming field effect transistors (FETs), wherein, for many types of complex circuitry, metal-oxide-semiconductor (MOS) technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. Miniaturization and increase of circuit densities represent ongoing demands.

A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed between the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a given extension of the channel region in the transistor width direction, the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length is a dominant design criterion for accomplishing an increase in the operating speed of the integrated circuits. As the channel length is reduced, the thickness of the gate dielectric is also reduced. The scaling of the gate dielectric is limited by several factors, such as defects, power supply voltage, time-dependent dielectric breakdown and leakage currents.

When forming source/drain regions of semiconductor devices, in particular for silicon-on-insulator (SOI) substrates, control of various capacitances is very important.

For instance, with regard to applications to ring oscillators, ring oscillator speed degrades with increasing gate/drain capacitance. This also includes contributing capacitances between the gate and the semiconductor material extending along the sidewalls of the gate structure. In order to minimize this capacitance, the distance from the semiconductor material extending along the sidewalls of a gate structure may be chosen to be large. This may be achieved by forming thicker spacers. However, while a large thickness of spacers would suppress the above-mentioned parasitic capacitance, it would contrast another requirement, said other requirement would be to have a close proximity of the raised source/drain region to a channel region so as to have a sufficient overlap capacitance between these two regions.

In view of the above, the present disclosure relates to semiconductor devices, in particular, transistor devices and techniques for forming transistor devices, allowing for fast ring oscillator speed high-frequency, while having sufficient overlap capacitance, which may be integrated in the process flow of fully depleted silicon-on-insulator (FDSOI) manufacturing.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally the subject matter disclosed herein relates to semiconductor devices and methods for manufacturing semiconductor devices wherein enhanced transistor performance may be obtained for N-channel transistors and P-channel transistors on the basis of fully depleted silicon-on-insulator (FDSOI) techniques.

The present disclosure discloses a method of forming a semiconductor device including providing a silicon-on-insulator (SOI) substrate comprising a semiconductor bulk substrate, a buried oxide layer formed on the semiconductor bulk substrate and a semiconductor layer formed on the buried oxide layer, forming a transistor device on the SOI substrate, including providing a gate structure on the semiconductor layer having a gate electrode and a first cap layer on the gate electrode, growing an oxide liner on the transistor device having a first part covering the gate structure and a second part covering the semiconductor layer, forming a second cap layer on the oxide liner, at least partially removing the second part of the oxide liner underneath the second cap layer and the first part of the oxide liner so as to form a recess on the semiconductor layer, and epitaxially forming raised source/drain regions on the semiconductor layer and in the recess.

The present disclosure further discloses a method of forming a silicon-on-insulator (SOI) substrate comprising a semiconductor bulk substrate, a buried oxide layer formed on the semiconductor bulk substrate and a semiconductor layer formed on the buried oxide layer, forming at least one N-channel field effect transistor (FET) device and at least one P-channel field effect transistor (FET) device on the SOI substrate, wherein the at least one N-channel FET device and the at least one P-channel field FET device are separated by shallow trench isolation regions so as to electrically isolate the transistor devices from each other, the step of forming the transistor device including providing a gate structure on the semiconductor layer having a gate electrode and a first cap layer on the gate electrode, growing an oxide liner on the transistor device having a first part covering the gate structure and a second part covering the semiconductor layer, forming a second cap layer on the oxide liner, at least partially removing the second part of the oxide liner underneath the second cap layer and the first part of the oxide liner so as to form a recess on the semiconductor layer, and epitaxially forming raised source/drain regions on the semiconductor layer and in the recess.

Furthermore, a semiconductor device is provided including a silicon-on-insulator (SOI) substrate comprising a semiconductor bulk substrate, a buried oxide layer formed on the semiconductor bulk substrate and a semiconductor layer formed on the buried oxide layer, a transistor device on the SOI substrate including a gate structure on the semiconductor layer having a gate electrode and a first cap layer on the gate electrode, an oxide liner on the transistor device having a first part covering the gate structure and a second part covering the semiconductor layer, a second cap layer on the oxide liner, the second part of the oxide liner having a recess underneath the second cap layer and the first part of the oxide liner on the semiconductor layer so to form a recess on the semiconductor layer, and raised source/drain regions provided on the semiconductor layer and in the recess.

Furthermore, a semiconductor device is provided including a silicon-on-insulator (SOI) substrate comprising a semiconductor bulk substrate, a buried oxide layer formed on the semiconductor bulk substrate and a semiconductor layer formed on the buried oxide layer, a transistor device on the SOI substrate including a gate electrode having a first cap layer on the gate electrode, a sidewall spacer structure adjacent to the gate electrode, comprising a first spacer, an oxide liner on the first spacer and a second spacer on the oxide liner, a recess on and parallel to the semiconductor layer underneath both the second spacer and at least a part of the oxide liner, and raised source/drain regions provided on the semiconductor layer and in the recess.

BRIEF DESCRIPTION OF THE DRAWINGS

The disclosure may be understood by reference to the following description taken in conjunction with the accompanying drawings, in which like reference numerals identify like elements, and in which.

Figure 1:
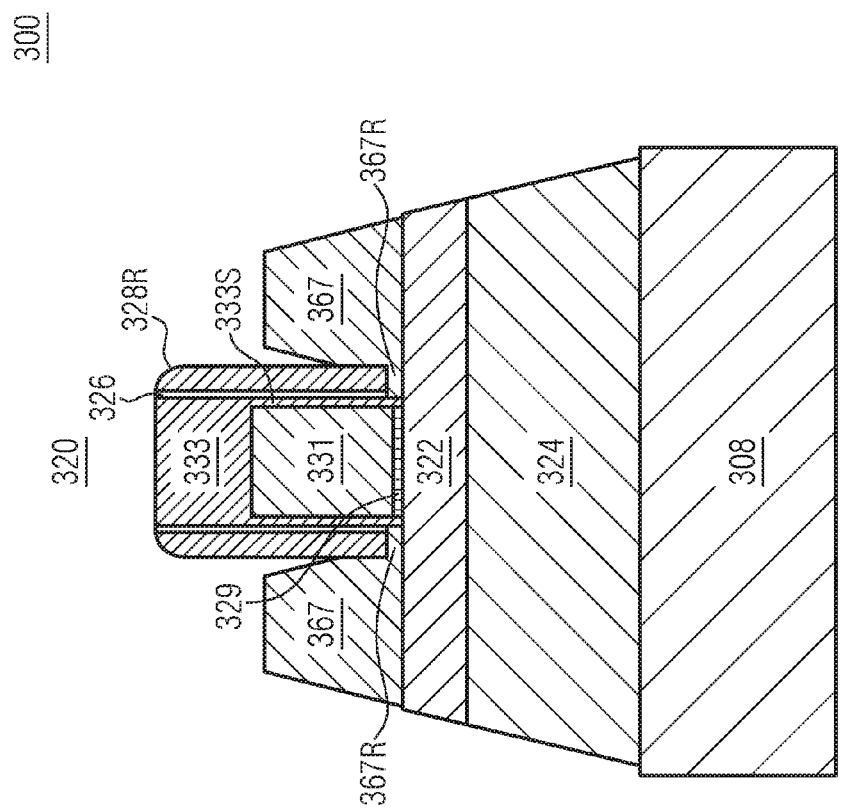
FIG. 1 illustrates a semiconductor device according to the present disclosure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to make use of the disclosure. It is to be understood that other embodiments would be evident, based on the present disclosure, and that system, structure, process or mechanical changes may be made without departing from the scope of the present disclosure. In the following description, numeral-specific details are given to provide a thorough understanding of the disclosure. However, it would be apparent that the embodiments of the disclosure may be practiced without the specific details. In order to avoid obscuring the present disclosure, some well-known circuits, system configurations, structure configurations and process steps are not disclosed in detail.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

As used herein, spatial references "top," "bottom," "upper," "lower," "vertical," "horizontal" and the like may be used for convenience when referring to structures of FET devices. These references are intended to be used in a manner consistent with the drawings only for teaching purposes, and are not intended as absolute references for FET structures. For example, FETs may be oriented spatially in any manner different from the orientations shown in the drawings. "Vertical" is used to refer to a direction normal to the semiconductor layer surface, and "horizontal" is used to refer to a direction parallel to the semiconductor layer surface when referring to the drawings. "Upper" is used to refer to a vertical direction away from the semiconductor layer. An element positioned "above" ("below") another one is located farther away from (closer to) the semiconductor layer surface as compared to the other one.

As will be readily apparent to those skilled in the art upon a complete reading of the present application, the present method is applicable to a variety of technologies, for example, NMOS, PMOS, CMOS, etc., and is readily applicable to a variety of devices, including, but not limited to, logic devices, memory devices, SRAM devices etc., in principle. The techniques and technologies described herein may be utilized to fabricate MOS integrated circuit devices, including NMOS integrated circuit devices, PMOS integrated circuit devices and CMOS integrated circuit devices. In particular, the process steps described herein are utilized in conjunction with any semiconductor device fabrication process that forms gate structures for integrated circuits, including both planar and non-planar integrated circuits. Although the term "MOS" properly refers to a device having a metal gate electrode and an oxide gate insulator, that term is used throughout to refer to any semiconductor device that includes a conductive gate electrode (whether metal or other conductive material) that is positioned over a gate insulator (whether oxide or other insulator) which, in turn, is positioned over a semiconductor bulk substrate.

FIG. 1 illustrates an example of a semiconductor device according to one illustrative embodiment of the present disclosure. FIG. 1 discloses a semiconductor device 300 having an N-channel field effect transistor or a P-channel field effect transistor active region having a gate structure 320. As illustrated in FIG. 1, the semiconductor device 300 comprises a semiconductor bulk substrate 308. A buried oxide (BOX) layer 324 is formed on the semiconductor bulk substrate 308. A semiconductor layer 322 is formed on the BOX layer 324. The semiconductor layer 322 may comprise a significant amount of silicon due to the fact that semiconductor devices of high integration density may be formed in volume production on the basis of silicon, due to the enhanced availability and the well-established process techniques developed over the last decades. However, any other appropriate semiconductor materials may be used, for instance, a silicon-based material containing other iso-electronic components, such as germanium, carbon, silicon/germanium, silicon/carbon, other II-VI or III-V semiconductor compounds and the like. In particular, in case the semiconductor device 300 being a transistor device is an N-channel FET, the semiconductor layer 322 may be a crystalline silicon layer, whereas if the transistor device is a P-channel FET, the semiconductor layer 322 may comprise silicon-germanium (SiGe) material.

As illustrated in FIG. 1, the gate structure 320 is formed over the semiconductor layer 322. The gate structure 320 of FIG. 1 has a gate electrode 331 and a first cap layer 333 on the gate electrode 331. Furthermore, the gate structure 320 may have a gate metal layer 329 on the semiconductor layer 322. The gate electrode 331 of the gate structure 320 may further include a gate dielectric, for example Hf-Oxide or Hf-Silica, and/or a work function-adjusting material layer. The gate structure 320 further comprises a cap layer 333. The cap layer 333 may comprise silicon nitride. The cap layer 333 may at least partially encapsulate the gate structure 320 on and above the semiconductor layer 322 and is used during fabrication. After fabrication, it may be removed at later process stages in order to be able to form silicided regions on the gate.

The gate structure 320 further comprises an oxide liner 326 covering the gate structure 320. In FIG. 1, it is illustrated that the oxide liner 326 substantially extends in a direction perpendicular to the semiconductor layer 322. The oxide liner 326 may comprise undoped silicon oxide (UDOX) or any other deposited oxide, e.g., Low Pressure Tetra Ethyl Ortho Silicate (LP-TEOS) or Sub-Atmospheric Tetra Ethyl Ortho Silicate (SA-TEOS).

As illustrated in FIG. 1, the oxide liner 326 substantially separates the cap layer 333 from another cap 328R serving as a nitride spacer on the oxide liner 326. It should be understood that the cap layer 333 is deposited before gate etching occurs. After gate etching has occurred, the cap layer 333 is substantially only present on top of the gate. In order to form a thin nitride spacer 328R directly on the gate sidewall, as is shown in FIG. 1, a deposition of a thin nitride layer is needed, followed by a subsequent etching process so as to form nitride spacer 328R. These steps are not shown here but are just similar steps as are illustrated in FIGS. 2-14. As is evident from FIG. 1, the thickness of the nitride spacer 328R may be independently chosen. Moreover, for the cap layer 333, a thickness of the cap layer 333 in a lateral direction with respect to the gate structure 320, which may also be termed a direction substantially parallel to the semiconductor layer 322, may also be chosen independently. Moreover, a thickness of the oxide liner 326 in the direction parallel to the semiconductor layer 322 may be selected independently of the thickness of the cap layer 333 or the nitride spacer 328R. Also, the thickness of the nitride spacer 328R in the direction parallel to the semiconductor layer 322 may be selected independently of the other thicknesses, i.e., the thickness of the cap layer 333 in either direction discussed above and/or the thickness of the oxide liner 326. Thus, the overlap of the channel region and a source/drain region 367 (see below) may be optimized independently of the optimization of gate/drain or fringe capacitances.

As illustrated in FIG. 1, the semiconductor device 300 further discloses epitaxially raised source/drain (RSD) regions 367 located in proximity of or adjacent to the gate structure 320. The raised source/drain regions 367 are provided on and above the semiconductor layer 322. In particular, the raised source/drain regions do not substantially extend into the semiconductor layer 322. As shown in FIG. 1, the gate structure 320 of the semiconductor device 300 exhibits a recess 367R underneath the other, or second, cap layer 328R and at least partially underneath the oxide liner 326. Thus, it depends on the process step length, how much oxide is removed. The recess 367R is also filled by the source/drain material 367. Thus, a small portion of the raised sourced drain regions 367, e.g., in the region 367R, is moved closer to the gate. Thereby, effectively a source/drain region 367 on either side of the gate structure 320 is provided. The region 367 is epitaxially raised, i.e., extends in a direction substantially perpendicular to the semiconductor layer 322. The source/drain region fills also the recess on either side of the gate structure 320, i.e., at the substrate level.

In other words, FIG. 1 illustrates a semiconductor device 300 having an N-channel field effect transistor or a P-channel field effect transistor active region. The semiconductor device 300 as illustrated in FIG. 1 comprises a silicon-on-insulator (SOI) substrate. The semiconductor device 300 comprises a semiconductor bulk substrate 308, a buried oxide layer 324 formed on the semiconductor bulk substrate 308 and a semiconductor layer 322 formed on the buried oxide layer 324. The semiconductor device 300 further has a gate electrode 331 having a first cap layer 333 on the gate electrode 331. As illustrated in FIG. 1, the semiconductor device 300 has a sidewall spacer structure 333S, 326, 328R adjacent to the gate electrode 331, the sidewall spacer structure comprising a first spacer 333S, an oxide liner 326 on the first spacer 333S and a second spacer 328R on the oxide liner 326. The semiconductor device 300 further has a recess 367R on and parallel to the semiconductor layer 322 underneath both the second spacer 328R and at least a part of the oxide liner 326. Thus, the direction of the recess 367R is substantially parallel to the semiconductor layer 322 and thus substantially perpendicular to the sidewall spacer structure, i.e., the oxide liner 326 and the second spacer 328R. The semiconductor device 300 further has raised source/drain regions 367 provided on the semiconductor layer 322 and in the recess 367R. Thus, the recess 367R is filled by the material of the source/drain regions 367. Neither the recess 367R nor the source drain regions 367 are provided in or reach into the semiconductor layer 322.

As further processing of fully depleted silicon-on-insulator (FDSOI) structures relies on out-diffusion of raised source/drain structures, providing the raised source/drain regions as shown in FIG. 1 may enhance out-diffusion close to the gate structure, i.e., close to the gate. Furthermore, the capacitances may be separately controlled and optimized so as to provide a higher ring oscillator speed.

FIGS. 2-14 illustrate, in accordance with one illustrative embodiment of the present disclosure, steps of a process flow for forming semiconductor devices similar to the semiconductor device of FIG. 1. As FIG. 1 illustrates a semiconductor device, the following process flow illustrates one illustrative embodiment of a method of forming a semiconductor device. For practical reasons, a process flow may include forming more than one semiconductor device at a time. In particular, FIGS. 2-14 illustrate forming at least one semiconductor device including a transistor device being an N-channel field effect transistor, together with forming another at least one semiconductor device including a transistor device being a P-channel field effect transistor. Here, a region of forming the N-channel field effect transistor and a region of forming the P-channel field effect transistor may be separated by insulating regions, such as shallow trench isolation regions.

Figure 2:
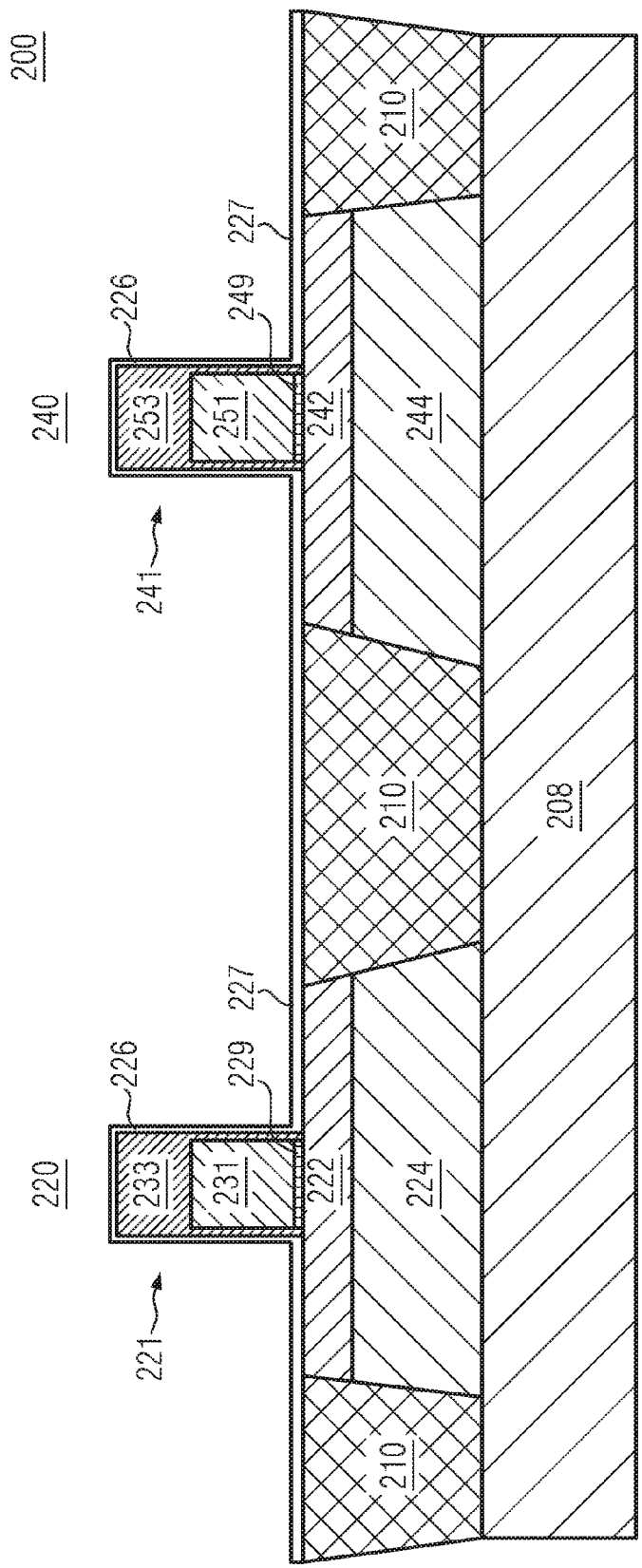
FIGS. 2-14 illustrate, in accordance with the present disclosure, steps of a process flow for forming semiconductor devices similar to the semiconductor device of FIG. 1.

FIG. 2 illustrates a semiconductor device 200 having an N-channel field effect transistor active region 220 and a P-channel field effect transistor active region 240. Similar to FIG. 1, the semiconductor device 200 comprises a semiconductor bulk substrate 208. A buried oxide layer 224 is formed on the semiconductor bulk substrate 208 in the N-channel region 220. Further, a buried oxide layer 244 is formed on the semiconductor bulk substrate 208 in the P-channel region 240. The buried oxide layers 224 and 244 may comprise similar materials. Further, semiconductor layers 222 and 242 are formed on the respective buried oxide layers 224 and 244. Semiconductor layers 222 and 242 may comprise a significant amount of silicon due to the fact that semiconductor devices of high integration density may be formed in volume production on the basis of silicon due to the enhanced availability and the well-established process techniques developed over the last decades. However, any other appropriate semiconductor materials may be used, for instance, a silicon-based material containing other iso-electronic components, such as germanium, carbon, silicon/germanium, silicon/carbon, other II-VI or III-V semiconductor compounds and the like. Semiconductor layers 222 and 242 may comprise different materials owing to the type of the transistor region, e.g., 220 or 240. In particular, for the N-channel field effect transistor 220, the semiconductor layer 222 may be a crystalline silicon layer. For the P-channel field effect transistor 240, the semiconductor layer 242 may comprise silicon-germanium (SiGe) material.

FIG. 2 illustrates that shallow trench isolation regions 210 are formed on the bulk substrate 208 so as to separate the semiconductor layer 222 and buried oxide layer 224 from the semiconductor layer 242 and buried oxide layer 244. In other words, the regions 220 and 240 are separated by the shallow trench isolation regions 210. The shallow trench isolation regions 210 may be etched into the wafer material.

FIG. 2 further illustrates that gate structures 221 and 241 are formed on the semiconductor layer 222 in the N-channel region 220 and on the semiconductor layer 242 in the P-channel region 240, respectively. Gate structures 221 and 241 include gate electrodes 231 and 251, respectively. Gate structures 221 and 241 further include cap layers 233 and 253, respectively. Cap layers 233 and 253 each may comprise silicon nitride. Cap layers 233 and 253 each may at least partially encapsulate the respective gate structures 221 and 241 on and above the corresponding semiconductor layers 222 and 242, respectively. Furthermore, the gate structures 221 and 241 may include gate metal layers 229 and 249, respectively, on the respective semiconductor layers 222 and 242. The gate electrodes 231 and 251 may further include a gate dielectric and a work function-adjusting material layer. The cap layers 233 and 253 may be provided by molecular layer deposition (not shown). An etching step may remove cap layer material from a surface of the semiconductor layers 222 and 242 (not shown) without consuming silicon-on-insulator material.

FIG. 2 further illustrates an oxide liner 226, 227 formed over the entire surface of the semiconductor device 200. The oxide liner 226, 227 may comprise undoped silicon oxide. A typical thickness of the oxide liner 227 may be on the order of 40-60 Å (4-6 nm) in the regions on the semiconductor layers 222 and 242 as well as the regions of the shallow trench isolators 210, respectively. However, the thickness of the oxide liner 226 on the gate structures 221 and 241, i.e., on the cap layers 233 and 253, may be different. In particular, while one forming step is applied, the growth rate of undoped silicon oxide of the oxide liner 226, 227 may be different on silicon or silicon-germanium material 222 and 242, on the one hand, and on the silicon nitride material of the cap layers 233 and 253 on the other hand. In particular, the thickness of the oxide liner 226 on the silicon nitride material of the cap layers 233 and 253 may be about a factor of two less, i.e., thinner, than the thickness of the oxide liner 227 on the other regions of the semiconductor device 200. Thereby, a thin layer of oxide liner 226 is provided over the gate structures 221 and 241, whereas elsewhere the layer of oxide liner 227 is about a factor of two thicker. Thus, effectively, the oxide liner includes two parts, one part of the oxide liner 226 over the cap layers 233 and 253 of the gate structures 221 and 241, respectively, and another part of the oxide liner 227 elsewhere, i.e., on the semiconductor layers 222 and 242, respectively. As the thickness of the oxide layer 226 only depends on the amount of material applied by the single forming step, the thickness of the oxide layer may be readily controlled.

Figure 3:
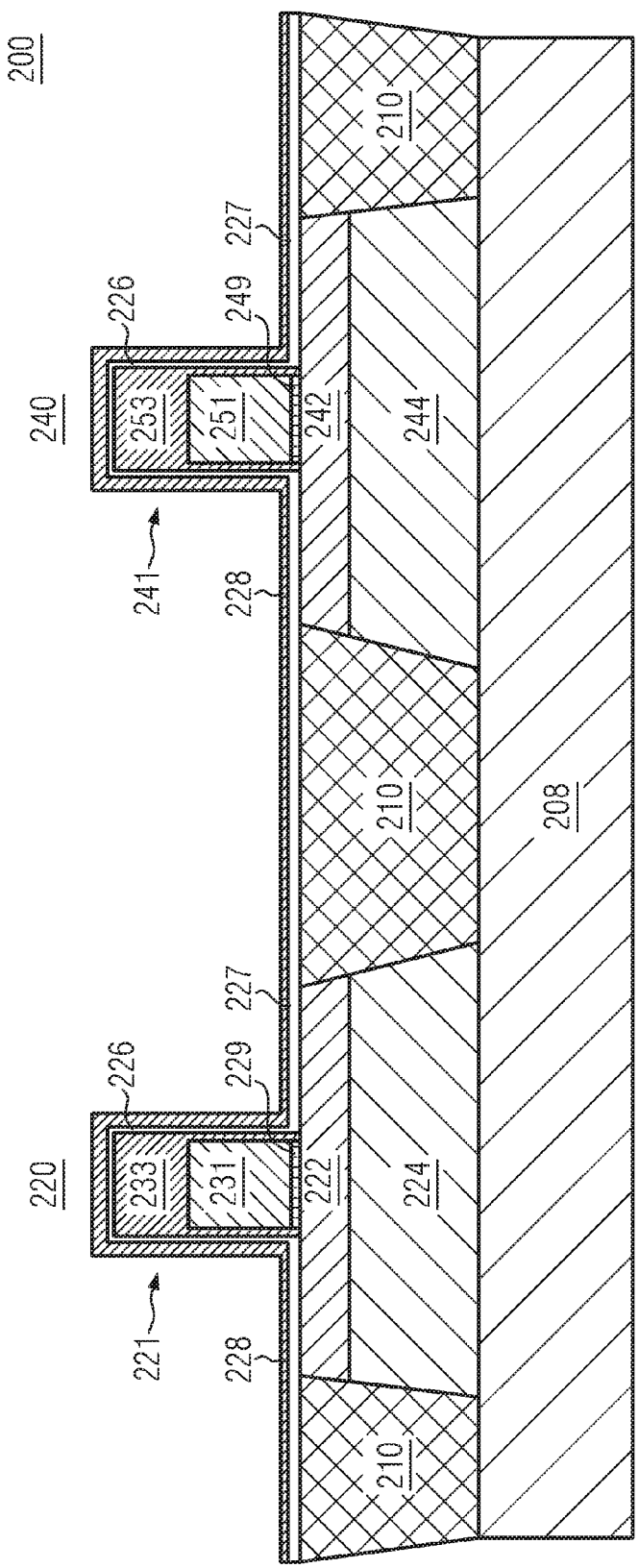

FIG. 3 illustrates a further forming step. FIG. 3 illustrates forming another layer of silicon nitride 228 on the oxide liner 226, 227. The layer of silicon nitride 228 serves as a second cap layer 228. The thickness of the second cap layer 228 may be chosen independently of any other of the thickness of layers of the semiconductor device 200. For the subsequent steps, it should be chosen whether to proceed first with the P-channel region 240 or with the N-channel region 220. In the following, the P-channel region 240 is chosen first. However it should be understood that the N-channel region 220 may be chosen first, as well.

Figure 4:
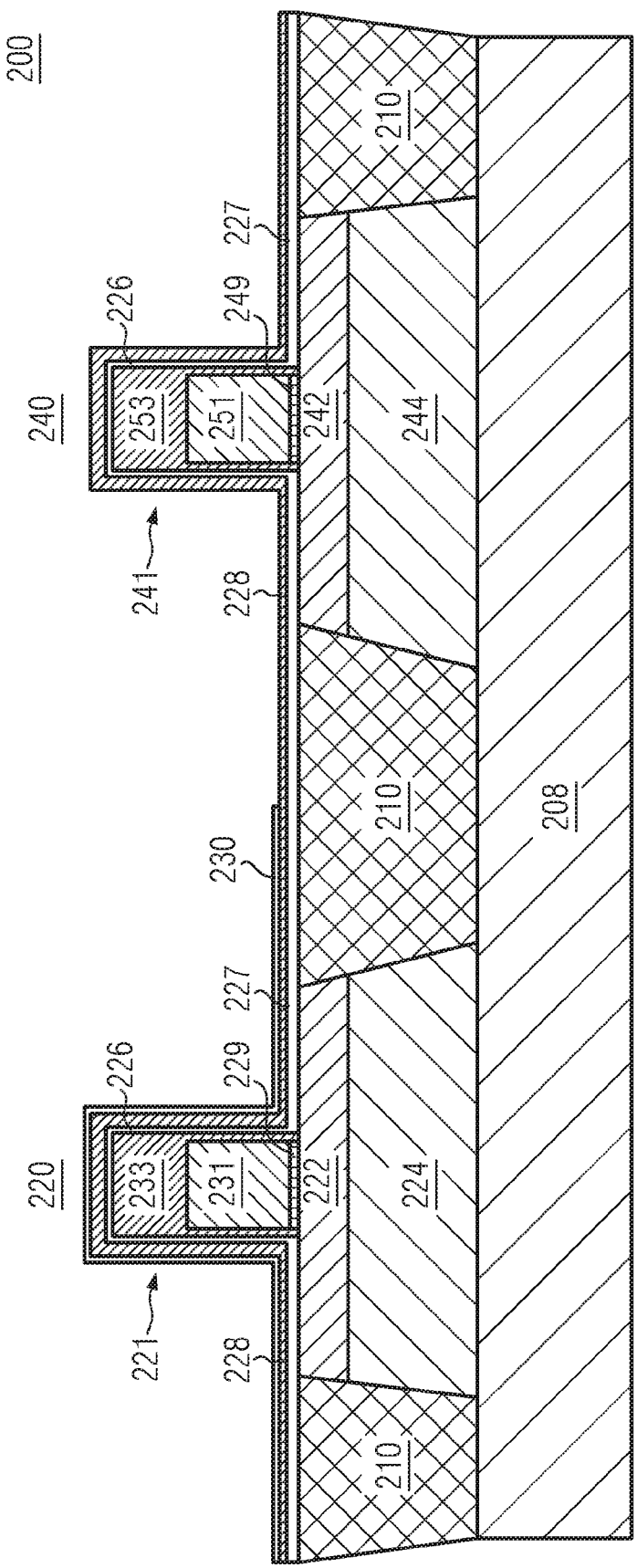

Having selected to proceed first with the P-channel region 240, FIG. 4 illustrates a masking step for the N-channel region 220. Thus, in accordance with well-understood masking procedures, a masking layer 230 is provided over the N-channel region 220 on the second cap layer 228. The masking layer 230 may thus provide etch protection in a subsequent step.

Figure 5:
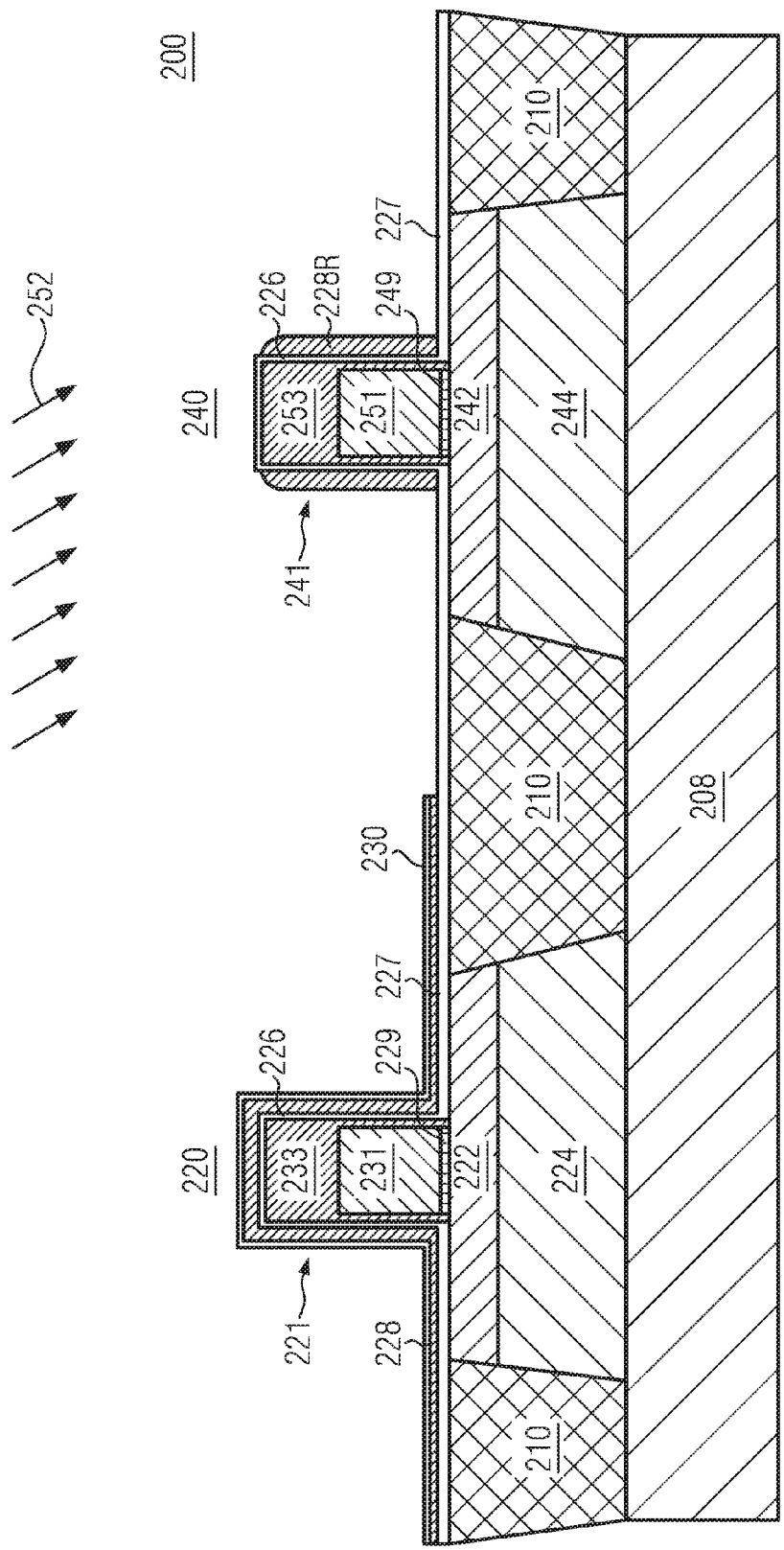

FIG. 5 illustrates an etching process 252 on the semiconductor device 200. The etching process 252 may utilize well-understood etching techniques for etching silicon nitride. The second cap layer 228 is removed from the oxide layer 226, 227 by the etching process 252. On the other hand, the N-channel region 220 is protected by the masking layer 230. The etching process 252 is stopped once the oxide layer 226 above the gate cap layer 253 is reached. Thus, at the top of the gate structure 241, i.e., on the gate cap layer 253, the oxide layer 226 is freed, again. Furthermore, on the sides of the gate structure 241 in a direction substantially perpendicular to the semiconductor layer 242, a remainder 228R of the second cap layer 228 is formed, serving as a nitride spacer. The thickness of this remainder, i.e., nitride spacer 228R, may be controlled by the etching process 252.

Figure 6:
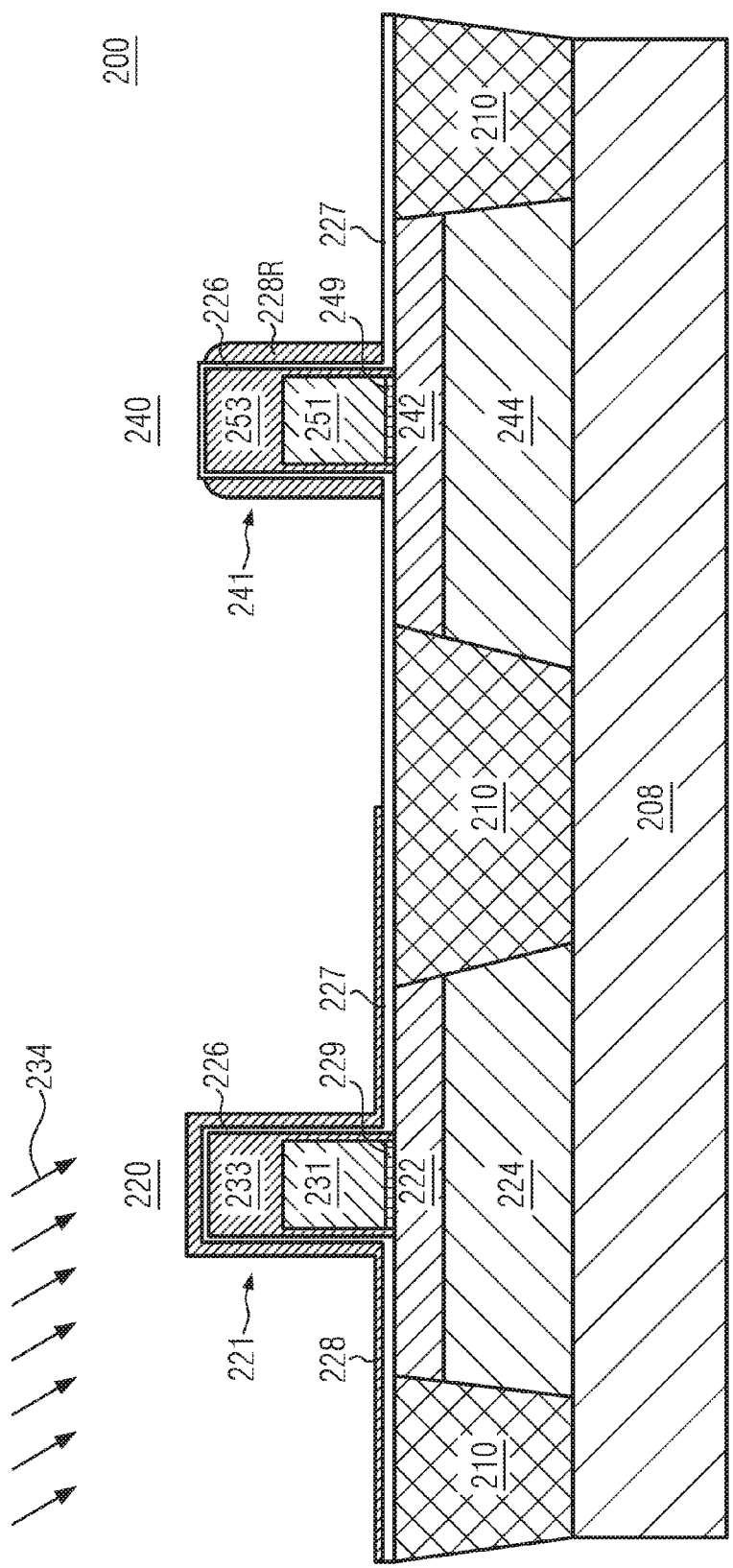

FIG. 6 illustrates a further processing step 234 so as to remove or strip the masking layer 230 on the N-channel region 220. The removal step may include well-understood techniques for mask removal. The mask removal step 234 as illustrated in FIG. 6 may serve as a preparatory step for a following etching step in the proximity of the gate structure 241 of the P-channel region 240.

Figure 7:
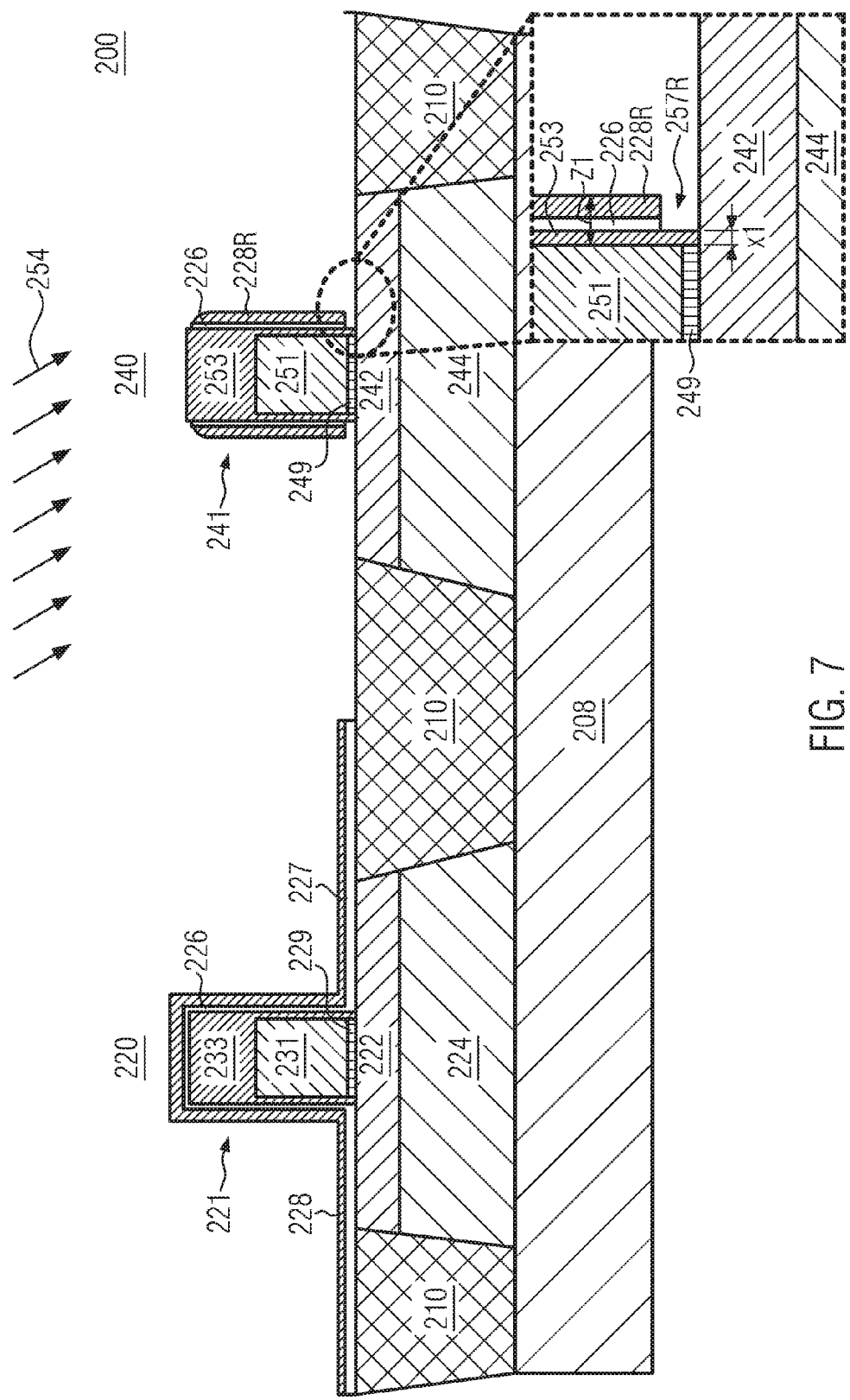

FIG. 7 illustrates a further processing step 254 so as to remove the part of the oxide liner 227 which was formed on the semiconductor layer 242 and on the shallow trench insulators 210. Processing step 254 may include an etching step using well-understood etching techniques. Thereby, the thicker part 227 of the oxide layer 226, 227 is removed from the semiconductor layer 242 in the P-channel region. Owing to the sequence of forming steps of FIGS. 2-6, the processing step 254 will also under-etch the remainder of the second cap layer 228R and the first part of the oxide liner 226 in a direction substantially parallel to the semiconductor layer 242 so as to form a recess 257R on and above the semiconductor layer 242. In other words, the second cap layer 228R will be under-etched in proximity to the gate structure 241. This is also indicated in the enlargement figure of FIG. 7. Further, the first part of the oxide liner 226 will also be at least partially removed by the processing step 254. As indicated in FIG. 7, the gate electrode 251 as well as gate metal layer 249 remain covered by the first cap layer 253. The thickness x1 of the first cap layer 253 in a direction substantially perpendicular to the gate electrode 251 and on the semiconductor layer 242 may be controlled by the intensity of the processing step. The longer the processing step 254 is applied, the thinner x1 gets. Moreover, the combined thickness Z1 of the first cap layer 253, the oxide layer 226 and the second cap layer 228R in a direction substantially perpendicular to the gate electrode 251 and on the semiconductor layer 242 is independent from the processing step 254; it is the sum of the deposition thicknesses. It should be noted that each of x1 and Z1 may be controlled independently and that it is also possible to only partially remove the oxide layer 226, so that the recess 257R is smaller than the sum of 226 and 228R layer thicknesses. Typical ranges for x1 are 4-8 nm, whereas Z1 may range between 8-20 nm, depending on the needed device performance requirements.

Figure 8:
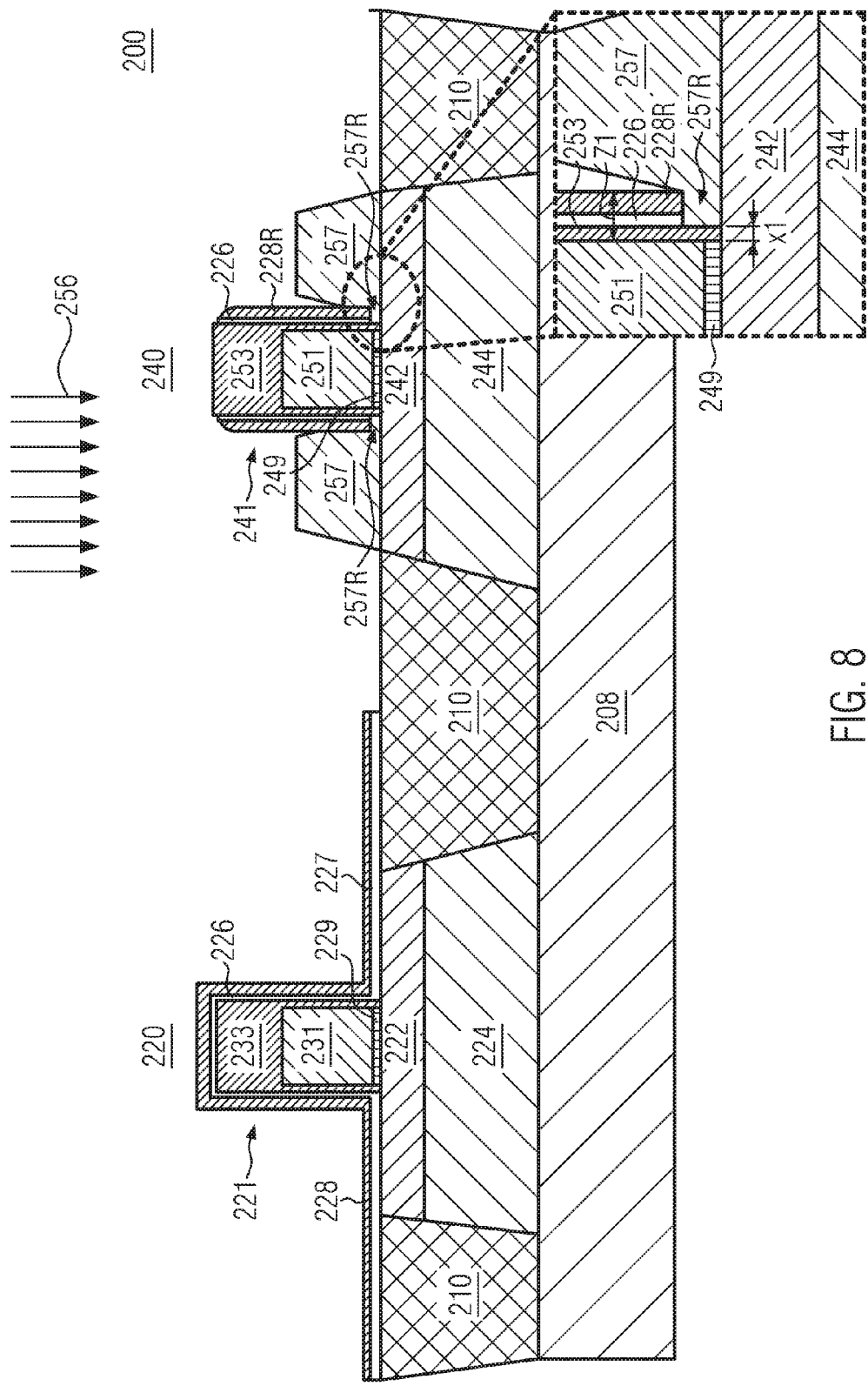

FIG. 8 illustrates a further processing step 256 for epitaxially growing raised source/drain regions 257 on the semiconductor layer 242 in the P-channel region 240. The raised source/drain regions 257 will raise in a direction substantially perpendicular to the semiconductor layer 242. The raised source/drain regions 257 will fill the recesses 257R on either side, i.e., in the proximity of the gate structure 241. Thereby, a small portion of the total raised source/drain regions 257 will be formed closer to the gate electrode 251. A larger part of the raised source/drain regions 257 will be formed further away from the gate electrode 251. Since all the thicknesses of the cap layers 253 and 228R, respectively, as well as the oxide layer 226, may be selected independently, the overall capacitances may be optimized.

Figure 9:
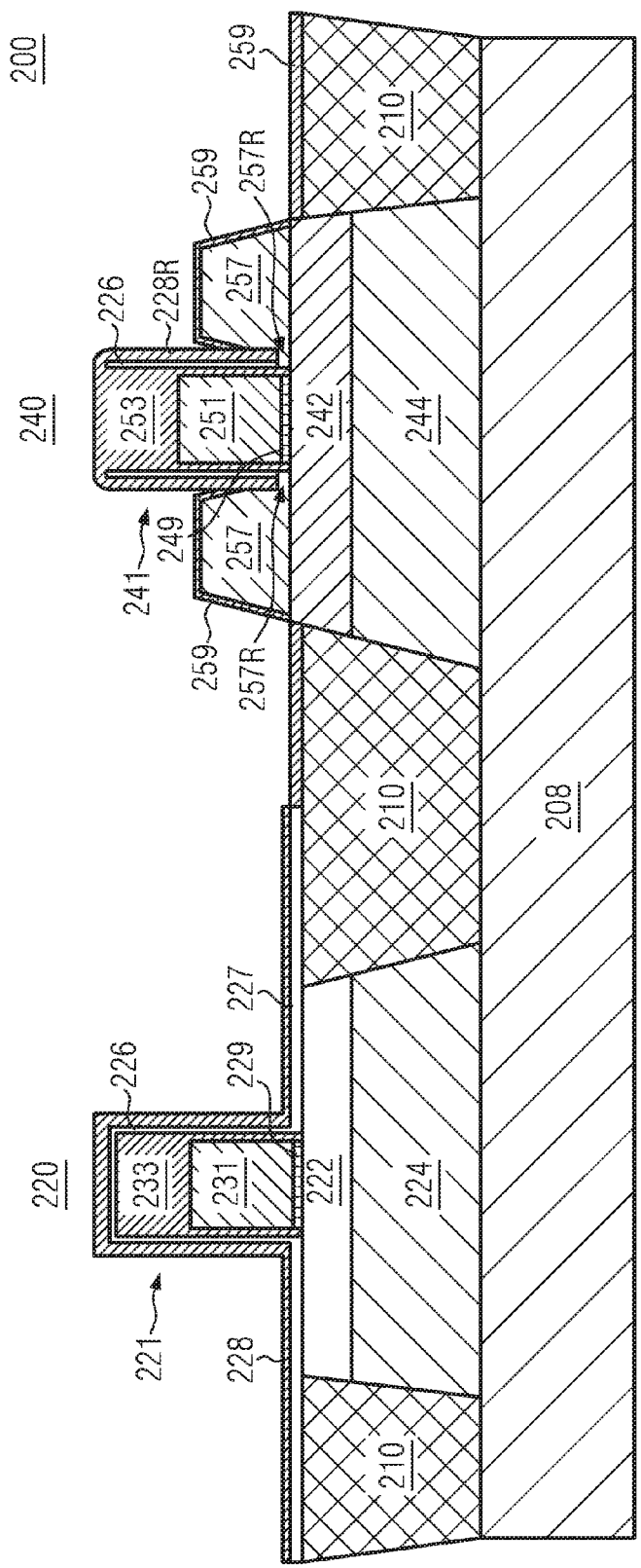

FIG. 9 shows a further processing step by covering semiconductor device 200 at least on the P-channel region 240 with a silicon nitride layer 259. Starting from FIG. 9, this includes preparatory steps for processing the N-channel region similarly as the P-channel region as illustrated with regard to FIGS. 3-8.

Figure 10:
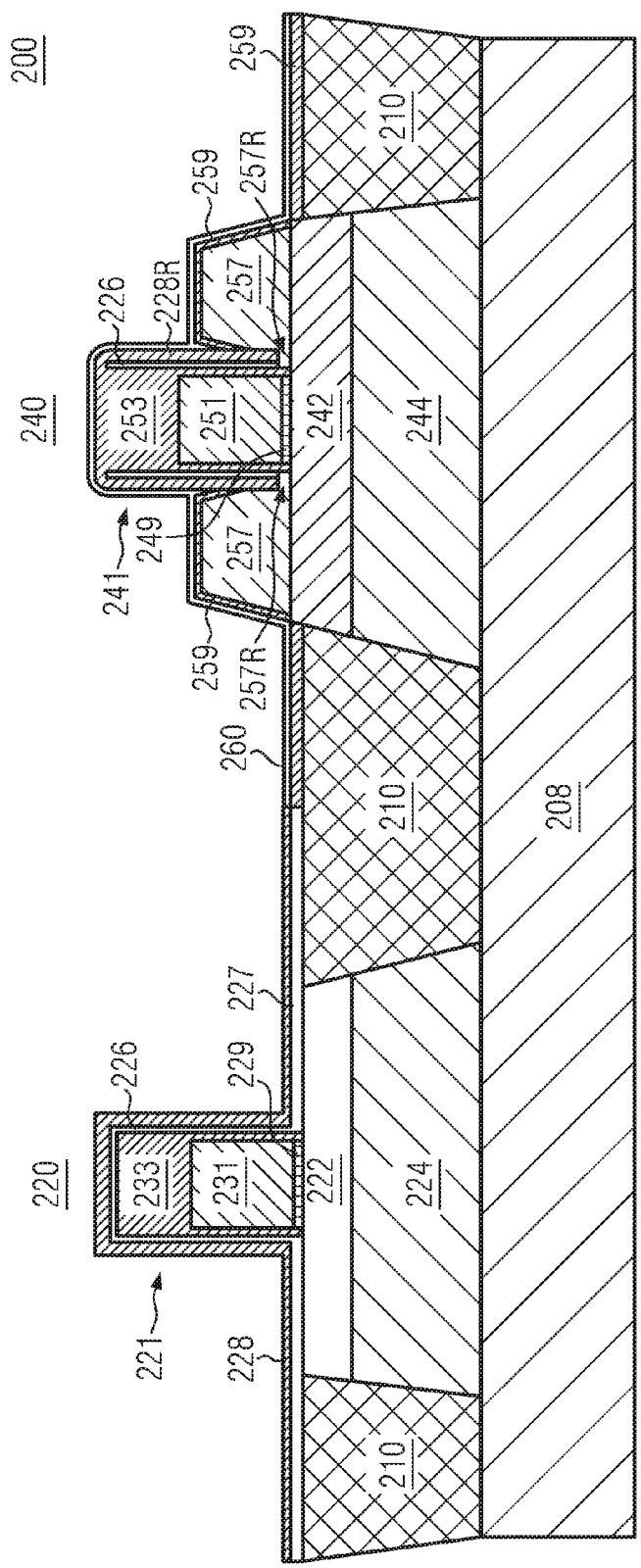

FIG. 10 illustrates a further processing step for providing a masking layer 260 over the P-channel region 240 so as to protect the P-channel region during further processing steps.

Figure 11:
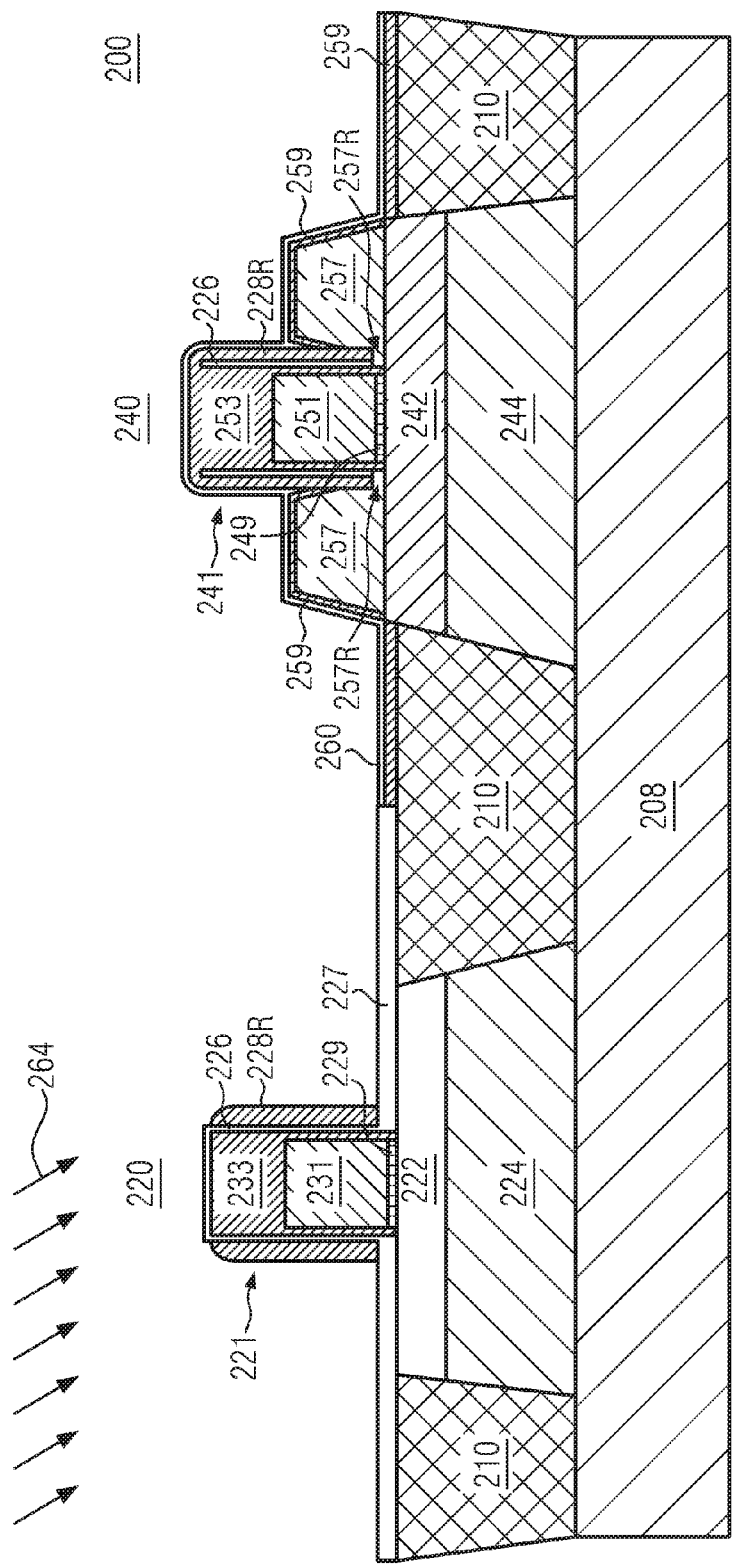

FIG. 11 illustrates yet a further processing step 264. The processing step 264 may be an etching process. The etching process 264 may utilize well-understood etching techniques for etching silicon nitride. The second cap layer 228 is removed from the oxide layer 226, 227 by the etching process 264. On the other hand, the P-channel region 240 is protected by the masking layer 260. The etching process 264 is stopped once the oxide layer 226 above the gate cap layer 233 is reached. Thus, at the top of the gate structure 221, i.e., on the gate cap layer 233, the oxide layer 226 is freed, again. Furthermore, on the sides of the gate structure 221 in a direction substantially perpendicular to the semiconductor layer 222, a remainder 228R of the second cap layer 228 is formed. The thickness of this remainder 228R may be controlled by the etching process 264.

Figure 12:
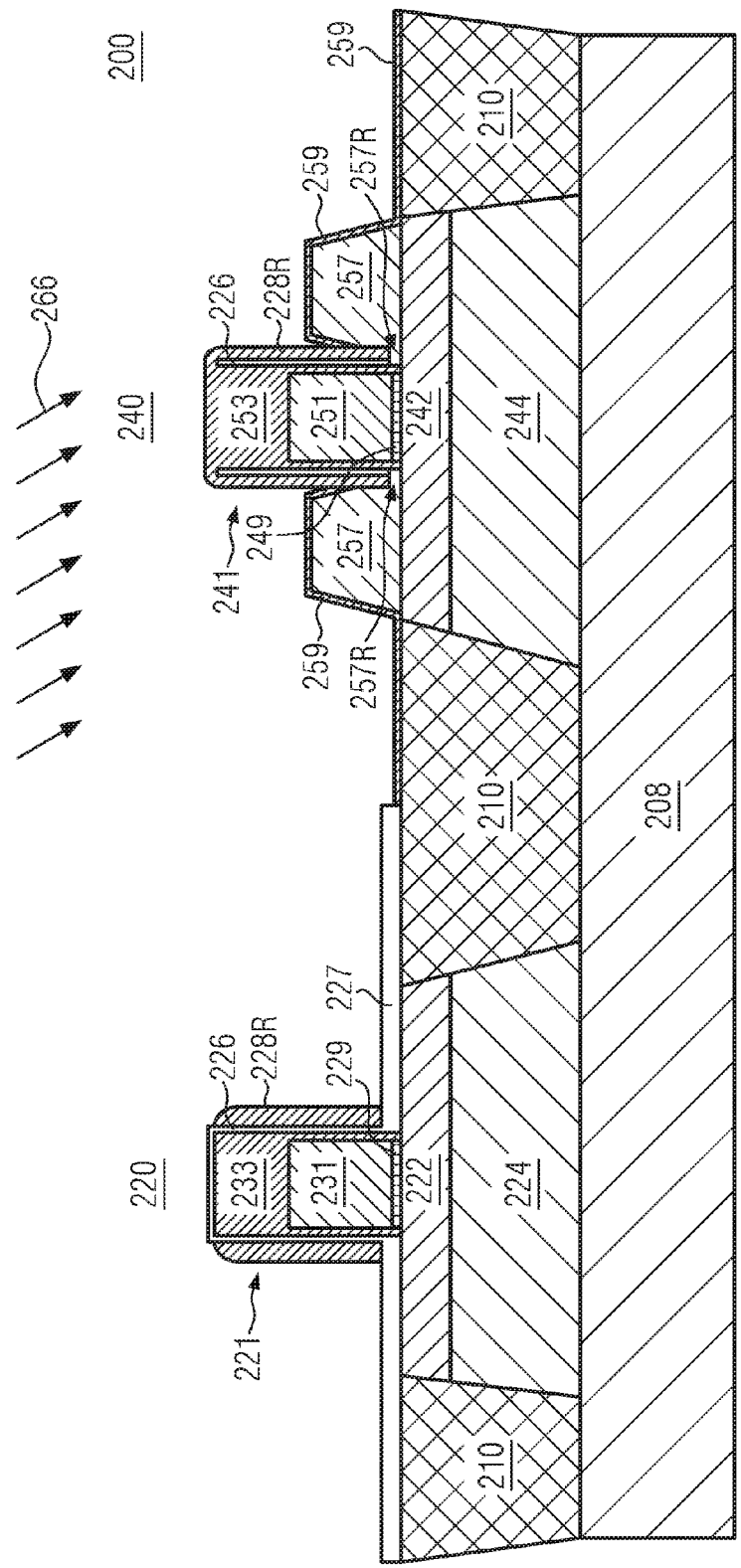

FIG. 12 illustrates a further processing step 266 so as to remove or strip the masking layer 260 on the P-channel region 240. The removal step may include well-understood techniques for mask removal. The mask removal step 266 as illustrated in FIG. 12 may serve as a preparatory step for a following etching step in the proximity of the gate structure 221 of the N-channel region 220.

Figure 13:
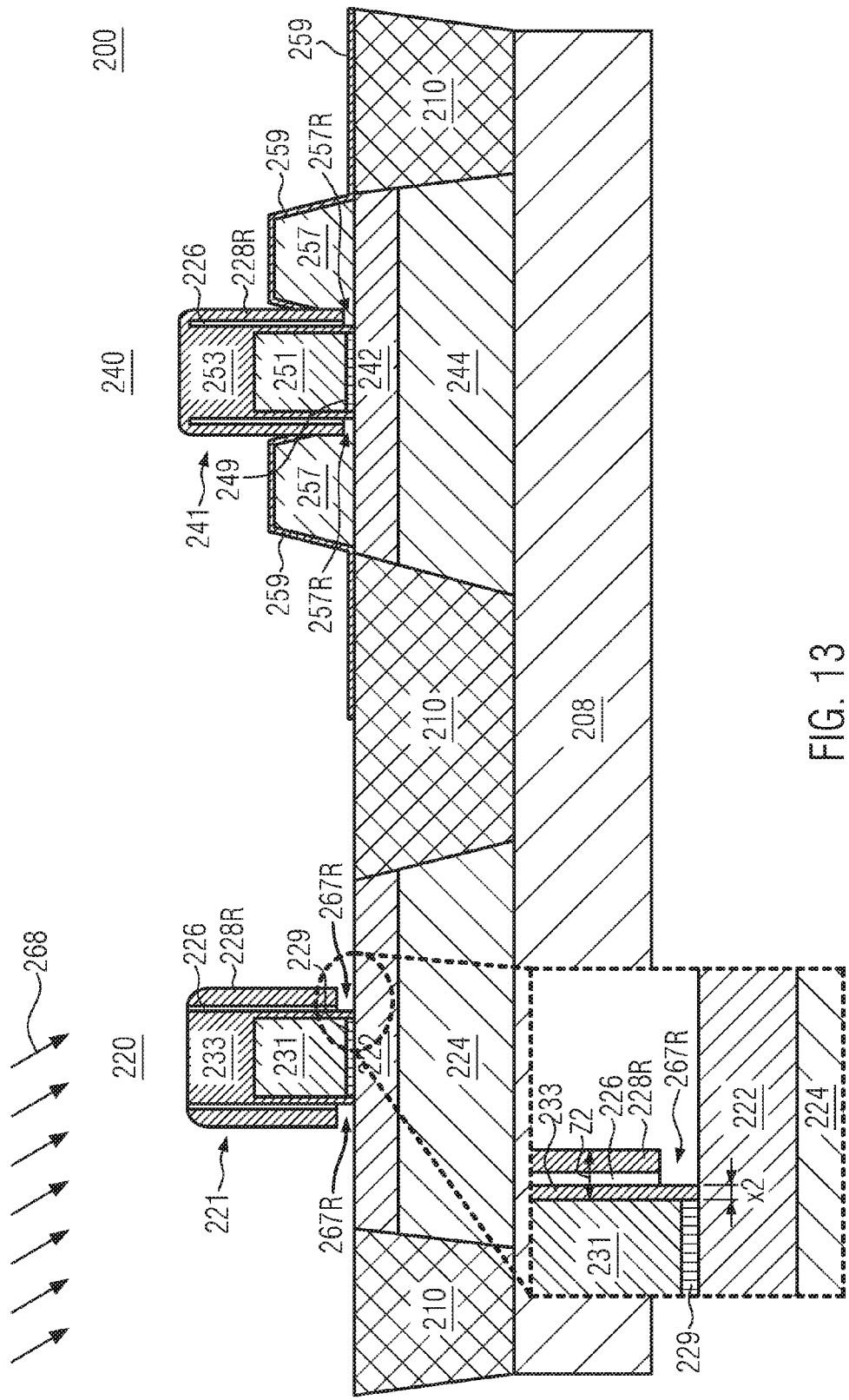

FIG. 13 illustrates a further processing step 268. Similar to FIG. 7, the processing step 268 serves to remove the part of the oxide liner 227 which was formed on the semiconductor layer 222 and on the shallow trench insulators 210. Processing step 268 may include an etching step using well-understood etching techniques. Thereby, the thicker part 227 of the oxide layer 226, 227 is removed from the semiconductor layer 222 in the N-channel region. Owing to the sequence of forming steps of FIGS. 9-12, the processing step 268 will under-etch the remainder of the second cap layer 228R and the first part of the oxide liner 226 in a direction substantially parallel to the semiconductor layer 222 so as to form a recess 267R on and above the semiconductor layer 222. In other words, the second cap layer 228R will be under-etched in proximity to the gate structure 221. This is also indicated in the enlargement figure of FIG. 13. Further, the first part of the oxide liner 226 will also be at least partially removed by the processing step 268. As indicated in FIG. 13, the gate electrode 231 as well as gate metal layer 229 remain covered by the first cap layer 233. The thickness x2 of the first cap layer 233 in a direction substantially perpendicular to the gate electrode 231 and on the semiconductor layer 222 may be controlled by the intensity of the processing step. The longer the processing step 268 is applied, the thinner x2 gets. Moreover, the combined thickness Z2 of the first cap layer 233, the oxide layer 226 and the second cap layer 228R in a direction substantially perpendicular to the gate electrode 231 and on the semiconductor layer 222 is independent from processing step 268. It should be noted that x2 and Z2 may be controlled independently.

Figure 14:
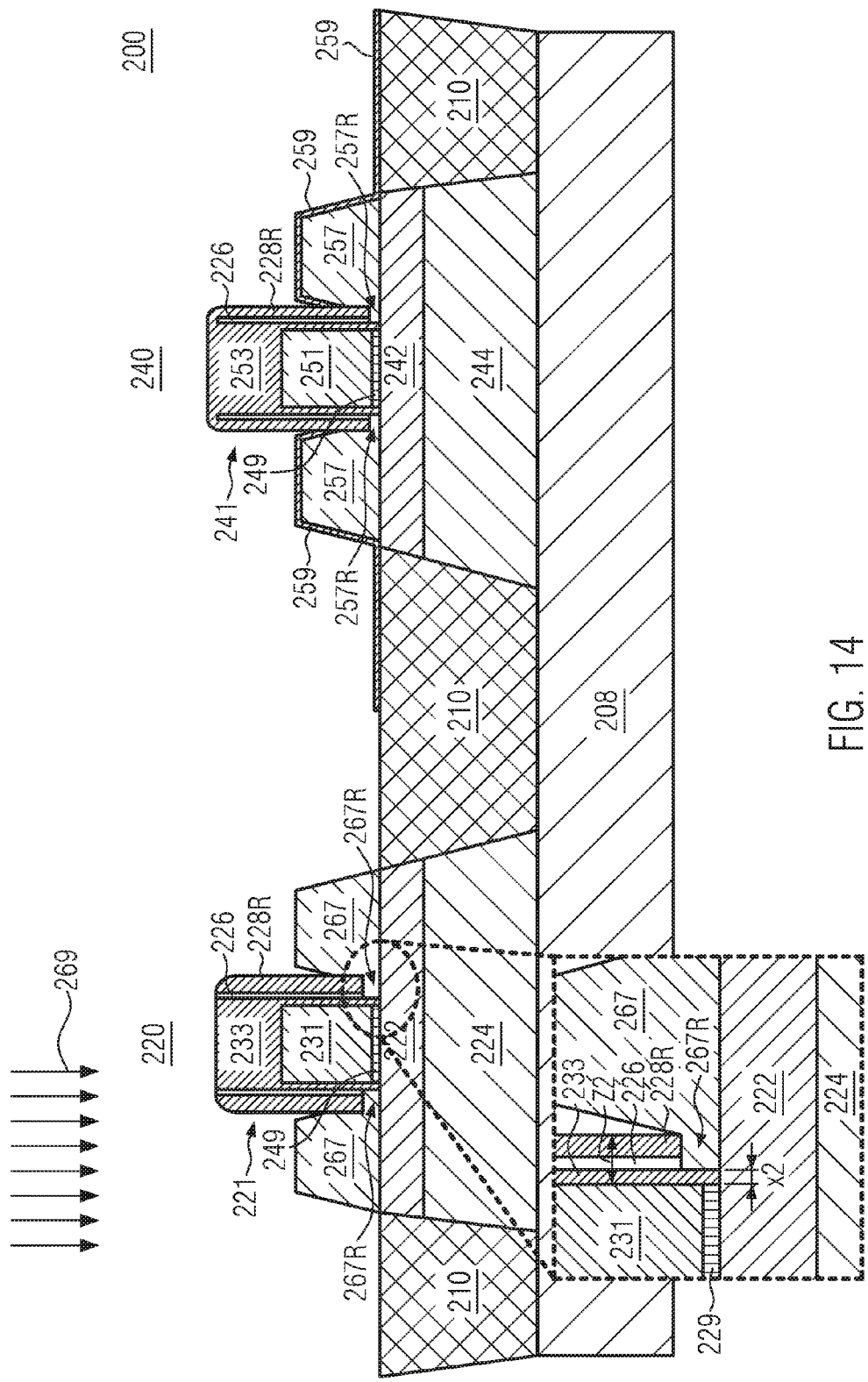

FIG. 14 illustrates a further processing step 269 for epitaxially growing raised source/drain regions 267 on the semiconductor layer 222 in the N-channel region 220. The raised source/drain regions 267 will raise in a direction substantially perpendicular to the semiconductor layer 222. The raised source/drain regions 267 will fill the recesses 267R on either side, i.e., in the proximity of the gate structure 231. Thereby, a small portion of the total raised source/drain regions 267 will be formed closer to the gate electrode 231. A larger part of the raised source/drain regions 267 will be formed further away from the gate electrode 231. Since all the thicknesses of the cap layers 233 and 228R, respectively, as well as the oxide layer 226, may be selected independently, the overall capacitances may be optimized.

These processing steps may be followed by standard processing steps for removal of the gate cap by well-understood dry etching techniques within standard flow schemes.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a short-hand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a semiconductor device, comprising:
   providing a semiconductor-on-insulator substrate comprising a semiconductor bulk substrate, a buried insulation layer formed on said semiconductor bulk substrate and a semiconductor layer formed on said buried insulation layer; and
   forming a transistor device on said semiconductor-on-insulator substrate comprising:
      providing a gate structure on said semiconductor layer, said gate structure comprising a gate electrode and a first cap layer on said gate electrode;
      growing an oxide liner on said transistor device having a first part covering said gate structure and a second part covering said semiconductor layer;
      forming a second cap layer on said oxide liner;
      at least partially removing said second part of said oxide liner underneath said second cap layer and said first part of said oxide liner so as to form a recess on said semiconductor layer; and
      epitaxially forming raised source/drain regions on said semiconductor layer and in said recess.

2. The method of claim 1, wherein said step of at least partially removing said second part of said oxide liner comprises under-etching said second cap layer and said first part of said oxide liner in a direction substantially parallel to said semiconductor layer so as to form said recess on said semiconductor layer.

3. The method of claim 1, wherein said transistor device is an N-channel field effect transistor (FET), said raised source/drain regions comprise N-doped silicon and said semiconductor layer is a crystalline silicon layer.

4. The method of claim 1, wherein said transistor device is a P-channel field effect transistor, said raised source/drain regions comprise P-doped silicon and said semiconductor layer comprises silicon-germanium material.

5. The method of claim 1, wherein at least one of said first cap layer and said second cap layer comprise silicon nitride, wherein said oxide liner comprises undoped silicon oxide (UDOX) and wherein a thickness of said first part of said oxide liner is about one-half of a thickness of said second part of said oxide liner.

6. The method of claim 1, further comprising selecting a thickness of each of said first cap layer, said second cap layer and said oxide liner independently.

7. The method of claim 1, wherein providing said gate structure further comprises providing a gate metal layer on said semiconductor layer.

8. A method of forming a semiconductor device, comprising:
   providing a semiconductor-on-insulator substrate comprising a semiconductor bulk substrate, a buried insulation layer formed on said semiconductor bulk substrate and a semiconductor layer formed on said buried insulation layer; and
   forming a transistor device above said semiconductor-on-insulator substrate comprising:
      forming a gate structure on said semiconductor layer, said gate structure comprising a gate electrode and a first silicon nitride cap layer on said gate electrode;
      growing an oxide liner on said transistor device having a first part covering said gate structure and a second part covering said semiconductor layer, wherein a thickness of said first part of said oxide liner is less than a thickness of said second part of said oxide liner;
      forming a second silicon nitride cap layer on said oxide liner;
      at least partially removing said second part of said oxide liner underneath said second silicon nitride cap layer and said first part of said oxide liner so as to form a recess on said semiconductor layer; and
      epitaxially forming raised source/drain regions on said semiconductor layer and in said recess.

9. The method of claim 8, wherein said step of at least partially removing said second part of said oxide liner comprises under-etching said second silicon nitride cap layer and said first part of said oxide liner in a direction substantially parallel to said semiconductor layer so as to form said recess on said semiconductor layer.

10. The method of claim 8, wherein said transistor device is an N-channel field effect transistor (FET), said raised source/drain regions comprise N-doped silicon and said semiconductor layer is a crystalline silicon layer.

11. The method of claim 8, wherein said transistor device is a P-channel field effect transistor, said raised source/drain regions comprise P-doped silicon and said semiconductor layer comprises silicon-germanium material.

12. The method of claim 8, wherein said oxide liner comprises undoped silicon oxide (UDOX) and wherein said thickness of said first part of said oxide liner is about one half or less than said thickness of said second part of said oxide liner.

13. The method of claim 8, further comprising selecting a thickness of each of said first silicon nitride cap layer, said second silicon nitride cap layer and said oxide liner independently.

14. The method of claim 8, wherein providing said gate structure further comprises providing a gate metal layer on said semiconductor layer.

* * * * *